United States Patent
Ma

(10) Patent No.: US 7,126,416 B2
(45) Date of Patent: Oct. 24, 2006

(54) PULSE AMPLITUDE MODULATION (PAM) METHOD AND CIRCUIT FOR IMPROVING THE PERFORMANCE OF A D-CLASS AUDIO AMPLIFIER

(75) Inventor: Tu Hsien Ma, Yonghe (TW)

(73) Assignee: Princeton Technology Corporation, Hsin Tien (TW)

( * ) Notice: Subject to any disclaimer, the term of this patent is extended or adjusted under 35 U.S.C. 154(b) by 169 days.

(21) Appl. No.: 10/989,393

(22) Filed: Nov. 17, 2004

(65) Prior Publication Data

US 2006/0103459 A1   May 18, 2006

(51) Int. Cl.
*H03F 3/38* (2006.01)
*H03F 3/217* (2006.01)

(52) U.S. Cl. .................... 330/10; 330/207 A
(58) Field of Classification Search .......... 330/10, 330/207 A, 251; 332/115, 116; 375/353
See application file for complete search history.

(56) References Cited

U.S. PATENT DOCUMENTS 5,973,368 A * 10/1999 Pearce et al. ............... 257/368
6,831,509 B1 * 12/2004 Mitamura .................... 330/10
7,049,885 B1 * 5/2006 Ishizaki ...................... 330/10

* cited by examiner

*Primary Examiner*—Steven J. Mottola
(74) *Attorney, Agent, or Firm*—Birch, Stewart, Kolasch & Birch, LLP

(57) ABSTRACT

The present invention provides a PAM (Pulse Amplitude Modulation) method and circuit for improving the performance of a D-class audio amplifier. The D-class audio amplifier is inputted with a PWM signal and designed to have a dead time function for time delay. In order to decrease the distortion of the output signal caused by the dead time design, the present invention comprises the following steps:

detecting the polarity of the current of an output terminal of the D-class audio amplifier; adding a voltage adjustment circuit to a power source of the D-class audio amplifier to lower the voltage of the power source of the D-class audio amplifier from high voltage to low voltage during dead time when the polarity of the current is negative; adding a voltage compensation circuit to a low voltage point of the D-class audio amplifier to compensate the voltage of the low voltage point of the D-class audio amplifier for ascending the voltage of the low voltage point from low voltage to high voltage during the dead time when the polarity of the current is positive.

7 Claims, 8 Drawing Sheets

PULSE AMPLITUDE MODULATION (PAM) METHOD AND CIRCUIT FOR IMPROVING THE PERFORMANCE OF A D-CLASS AUDIO AMPLIFIER

BACKGROUND OF THE INVENTION

1. Field of the Invention

The present invention relates to a PAM (Pulse Amplitude Modulation) method and circuit for improving the performance of a D-class audio amplifier, and more particularly to a method and circuit capable of reducing the disadvantages caused by the dead time design in a D-class audio amplifier.

2. Description of the Prior Arts

Referring to FIG. 1, which is an illustrative view for showing a conventional D-class audio amplifier. Pulse Width Modulation (PWM) signal $V_{PWM}$ is inputted to NMOS 1 (N-Type Metal Oxide Semiconductor) and NMOS 2 located at the left side, and to NMOS 3 and NMOS 4 located at the right side of the D-class audio amplifier. Three inverters 5, 6 and 7 are arranged therebetween, as shown in the figure. The signals inputted to the gate of NMOS 1, NMOS 2, NMOS 3 and NMOS 4 are designated by TA+, TA−, TB+ and TB− respectively. The connecting point A between NMOS 1 and NMOS 2, and the connecting point B between NMOS 3 and NMOS 4 are output terminals, and a loudspeaker 8 (represented by an inductor) is connected between the connecting points A and B. Four diodes 9, 10, 11 and 12 are connected between a power source $V_{cc}$ and a point N (low voltage point).

PWM signal $V_{PWM}$ is the square wave as shown at the bottom of FIG. 2, and the pulse width of the square wave represents the amplitude of the original analog signal $V_{signal}$ (the sine waves on the left side of FIG. 1 and at the top of FIG. 2). The analog signal $V_{signal}$ is cut by the triangular signal $V_{triangle}$ after passing through the comparator 13 at the left side of FIG. 1, and then is turned into the square wave $V_{PWM}$.

To simplify the explanation, please refer to FIG. 3, the signal $V_{signal}$ is a constant voltage waveform instead of a sine wave, and the resulting ideal PWM waveforms inputted to NMOS 1 and NMOS 2 are indicated by TA+ and TA−, which are two waveforms inverted with each other. The waveforms of TB+ and TB− are functionally and morphologically identical to the waveforms TA+ and TA−, so further remarks will be omitted.

After this ideal PWM waveforms TA+ and TA− are inputted to NMOS 1 and NMOS 2, at the instant when TA+ and TA− change their status (point "a" in FIG. 3), NMOS 1 and NMOS 2 may be turned on simultaneously due to logic confusions. Thereby, a momentary high current will be produced to destroy NMOS 1 and NMOS 2. Similarly, NMOS 3 and NMOS 4 may also be destroyed by TB+ and TB−.

To prevent NMOS 1, NMOS 2, NMOS 3 and NMOS 4 from being destroyed, a circuit designer will delay the status change of the later waveform at the moment when TA+, TA−, TB+ and TB− change their statuses, thus forming a dead time, as shown by TA+(dt) and TA− (dt) in FIG. 3.

Although the dead time design can prevent NMOS 1, NMOS 2, NMOS 3 and NMOS 4 from being destroyed, diodes 9, 10, 11 and 12 will still be turned on. For example, if diode 9 is on (that means the inductor current is negative, $i_L<0$), the waveform of $V_A$ (the voltage at point A in FIG. 1) will be changed in such a way as shown by the waveform at the bottom left of FIG. 3, the waveform used to decline at point a, but now it starts to decline after a period of time Δt, thus forming a "superfluous" area 31. If diode 10 is on (that means the inductor current is positive, $i_L>0$), then the waveform of $V_A$ will change in such a way as shown by the waveform at the bottom right of FIG. 3, the waveform used to rise at point b, but now it starts to rise after a period of time Δt, thus forming a "loss" area 32.

Referring to FIG. 4, if the ideal output $V_A$ is a sine wave, then the real output will be distorted and unsmooth due to the influence of the dead time design, as shown by the dotted waveform in FIG. 4. This distorted real output will lead to an increase in total harmonic distortion (THD), thus spoiling the sound quality.

The present invention has arisen to mitigate and/or obviate the afore-described disadvantages.

SUMMARY OF THE INVENTION

The primary object of the present invention is to provide a PAM method for improving the performance of a D-class audio amplifier. The D-class audio amplifier is inputted with a Pulse Width Modulation (PWM) signal and designed to have a dead time design for time-delay function. In order to decrease the distortion of the output signal caused by the dead time design, the present invention comprises the following steps:

connecting a resistor and a loudspeaker in series to an output terminal of the D-class audio amplifier, and designing a decision circuit to determine the polarity of the current flowing through the resistor;

adding a voltage adjustment circuit to a power source of the D-class audio amplifier to lower the voltage of the power source of the D-class audio amplifier from high voltage to low voltage during dead time when the current of the resistor is negative;

adding a voltage compensation circuit to a low voltage point of the D-class audio amplifier to compensate the voltage of the low voltage point of the D-class audio amplifier for ascending the voltage of the low voltage point from low voltage to high voltage during the dead time when the current of the resistor is positive;

The present invention will become more obvious from the following description when taken in connection with the accompanying drawings, which show, for purpose of illustrations only, the preferred embodiment in accordance with the present invention.

DETAILED DESCRIPTION OF THE PREFERRED EMBODIMENT

Figure 5:
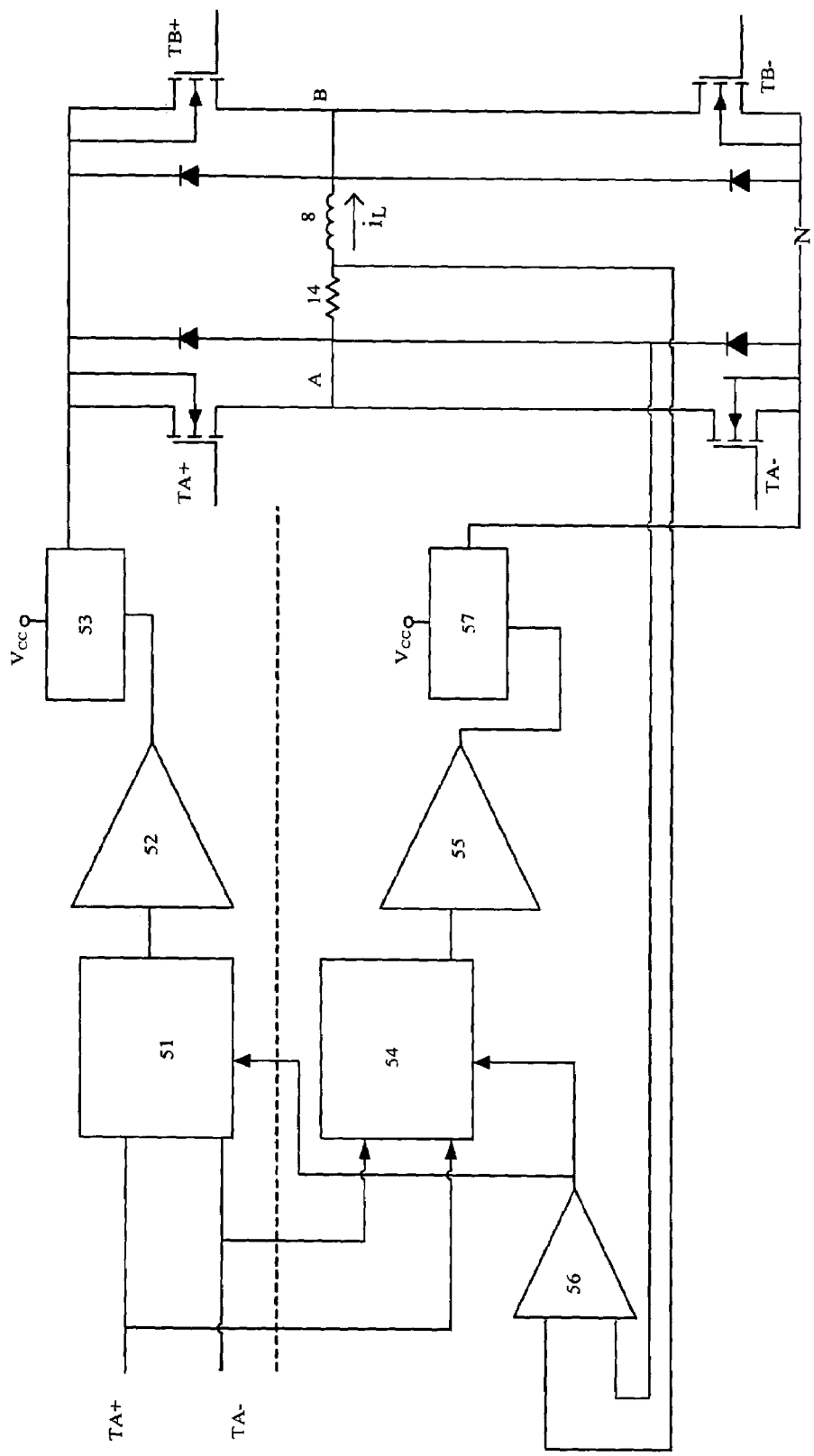
FIG. 5 shows a circuit block diagram in accordance with the present invention.

Referring to FIG. 5, which is a circuit block diagram in accordance with the present invention, TA+ and TA− are used as examples for explanation, however, TB+ and TB− are also applicable to this circuit block.

The circuit of the conventional D-class audio amplifier is shown at the right part of FIG. 5. In this embodiment, between the points A and B a resistor 14 is connected in series with a loudspeaker 8. The circuit block diagram in accordance with the present invention is shown at the left part of FIG. 5, which is divided into the upper and the lower portions by the dotted line. The upper portion is a voltage adjustment circuit, and the lower portion is a voltage compensation circuit.

The voltage adjustment circuit comprises a "superfluous area" detection pulse generator 51, an integrator 52 and a voltage regulator 53. The voltage compensation circuit comprises a "loss area" detection pulse generator 54, an integrator 55, a decision circuit 56 for judging the polarity of the current, and a voltage regulator 57. TA+ and TA− are inputted to the "superfluous area" detection pulse generator 51 and "loss area" detection pulse generator 54. The voltages at both ends of the resistor 14 are inputted to the decision circuit 56 and then outputted to the "superfluous area" detection pulse generator 51 and "loss area" detection pulse generator 54 respectively. The output of the integrator 52 controls the voltage regulator 53 so as to adjust the voltage of $V_{cc}$, and the output of the integrator 55 controls the voltage regulator 57 so as to compensate the voltage at point N.

Figure 1:
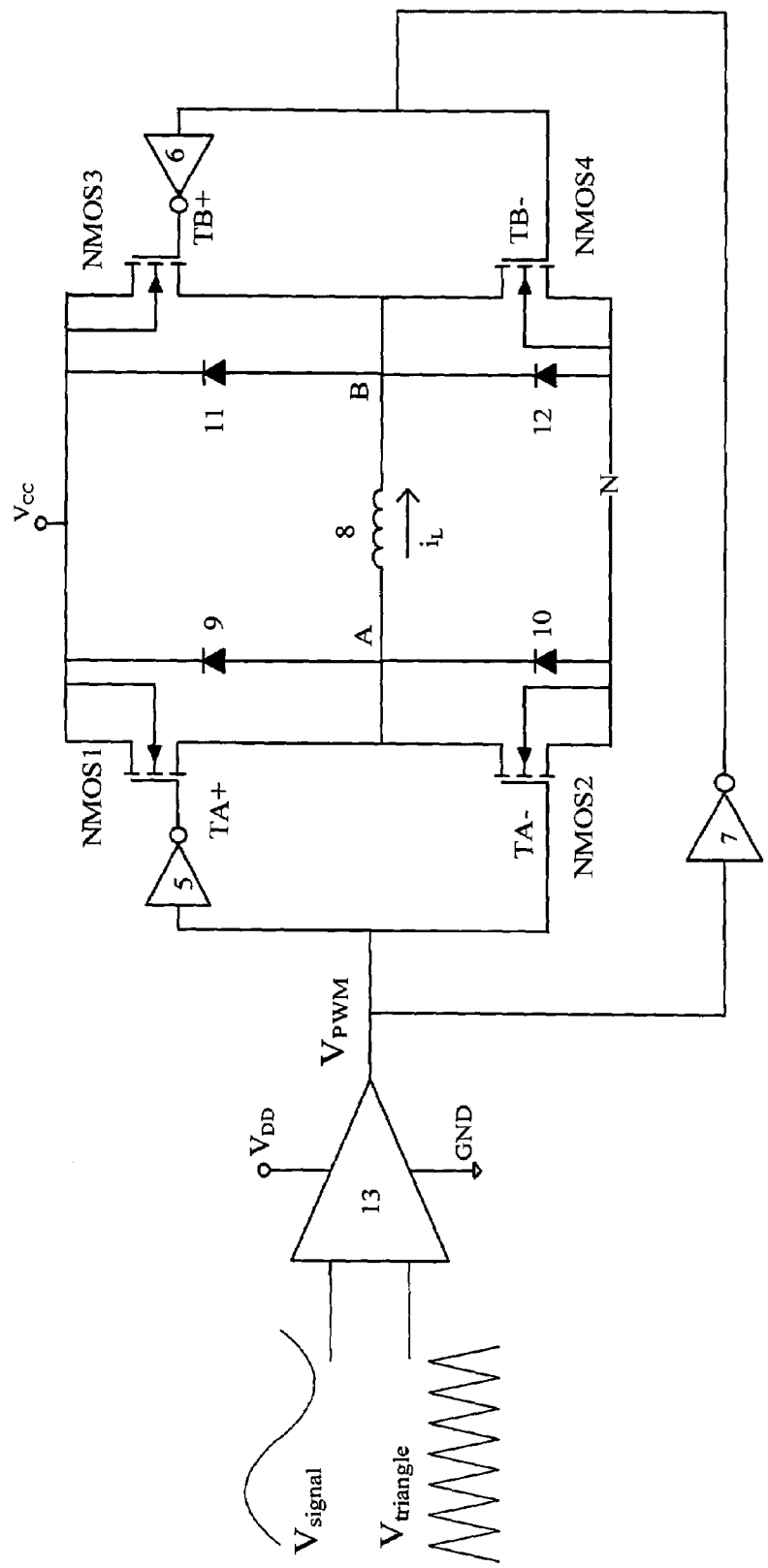
FIG. 1 is an illustrative view for showing a conventional D-class audio amplifier.
Figure 2:
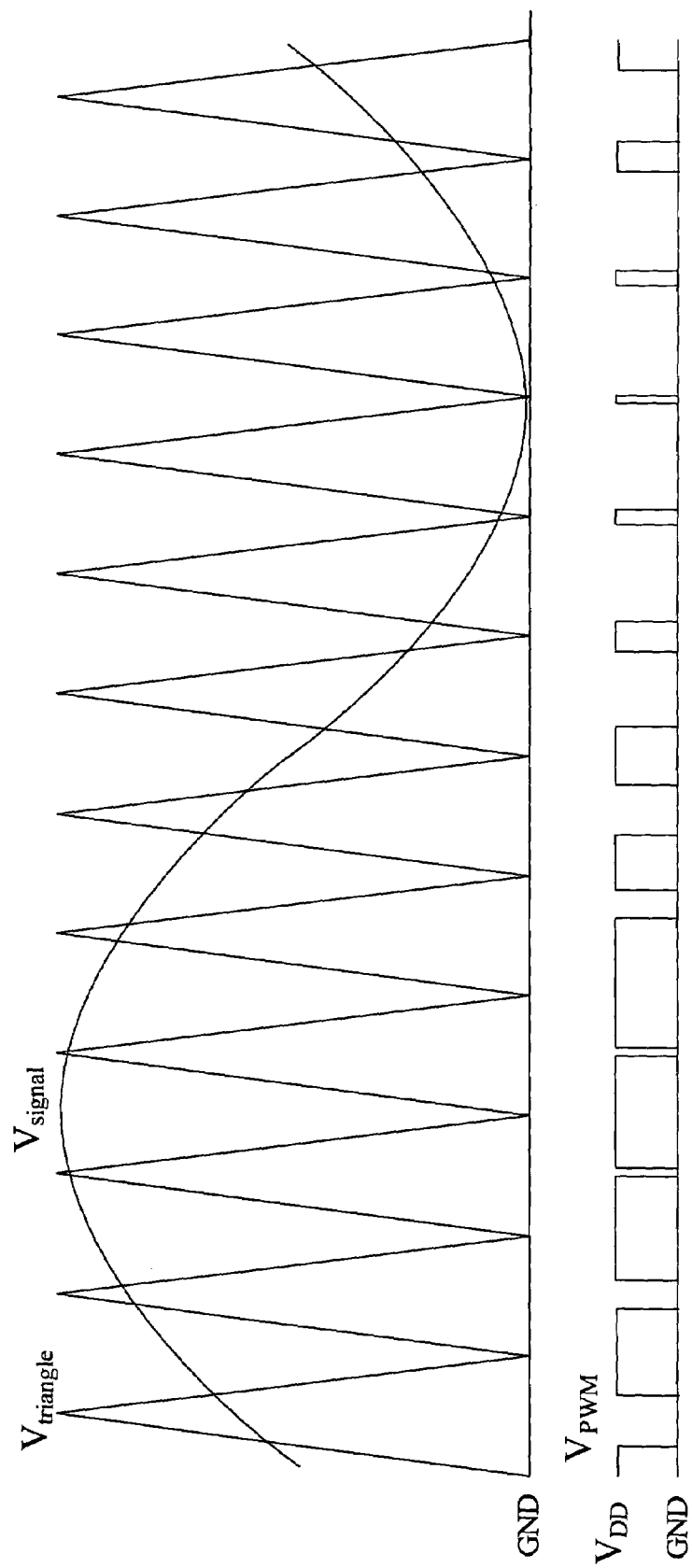
FIG. 2 is an illustrative view for showing the generation of PWM signal for a conventional D-class audio amplifier.
Figure 3:
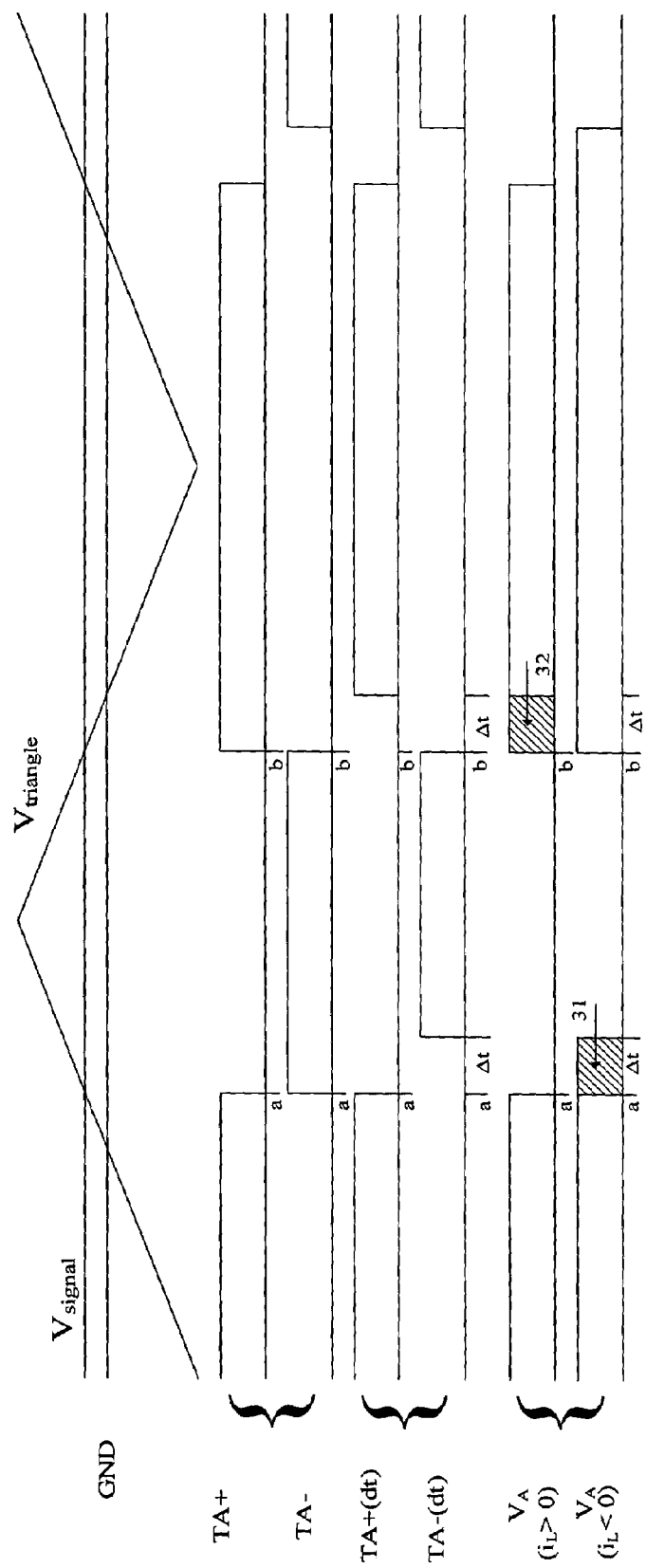
FIG. 3 is an illustrative view for showing the "dead time" design added in a PWM signal of a conventional D-class audio amplifier.
Figure 4:
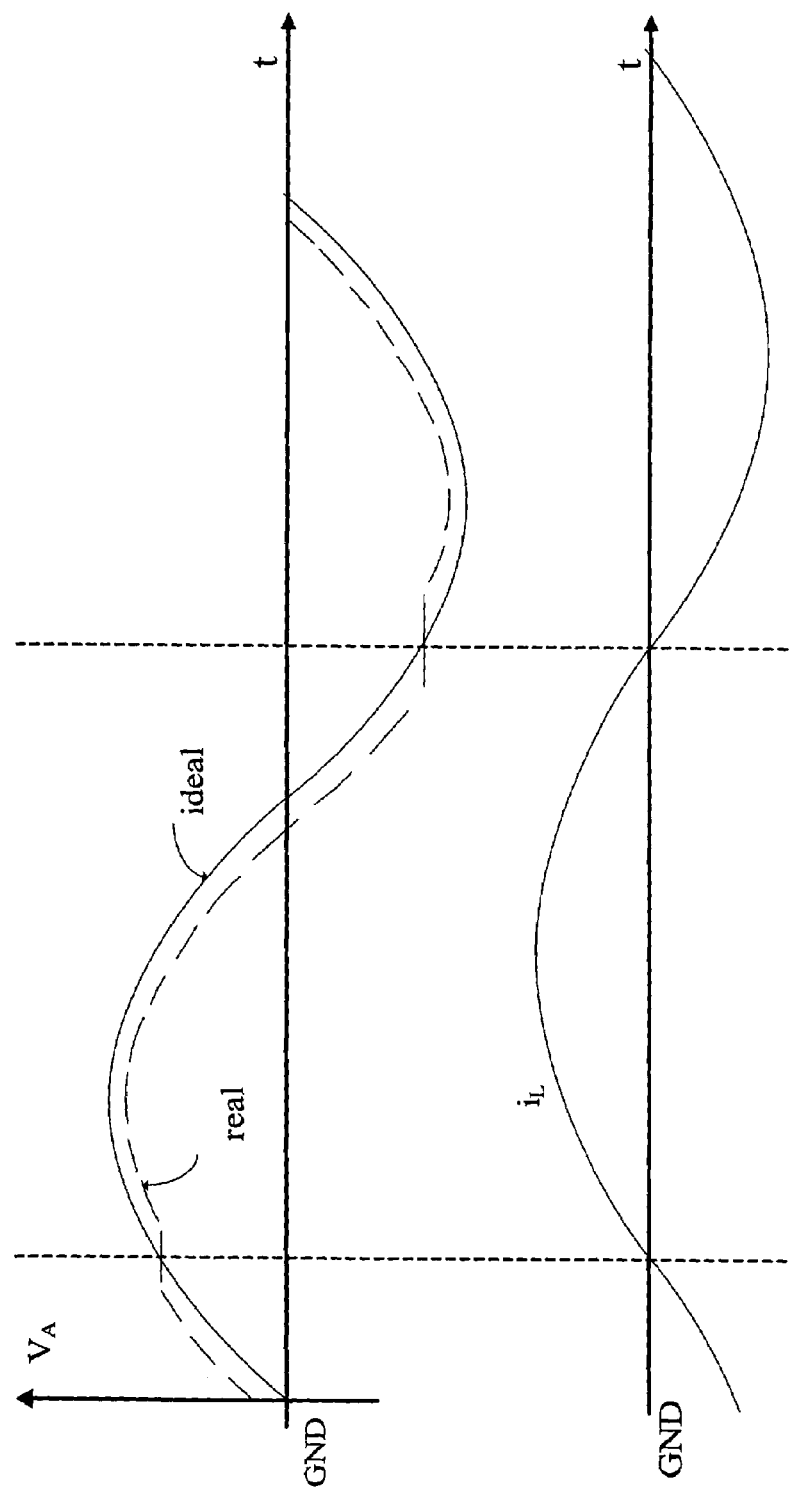
FIG. 4 is an illustrative view for showing the distortion of output signal of a conventional D-class audio amplifier caused by the dead time design.
Figure 6:
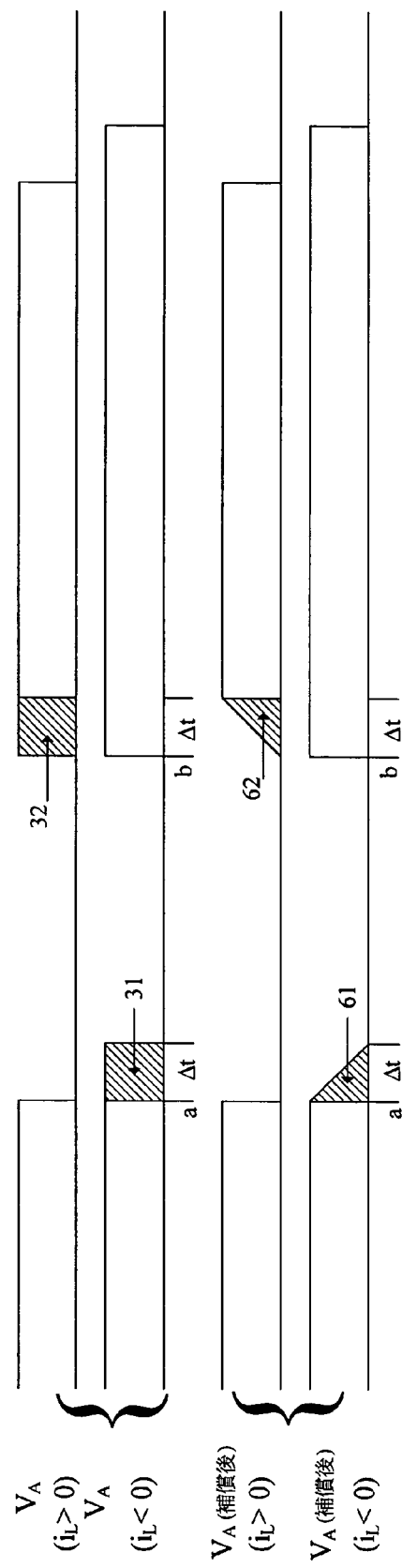
FIG. 6 shows the improvements to the dead time design in accordance with the present invention

The voltage adjustment circuit is designed to drag the voltage of $V_{cc}$ so as to turn the "superfluous area" 31 of FIG. 3 into the "triangular area" 61 at the bottom right of FIG. 6. The voltage compensation circuit is designed to compensate the voltage at point N so as to turn the "loss area" 32 of FIG. 3 into the "triangular area" 62 at the bottom left of FIG. 6. Through this way, the original "superfluous area" and the "loss area" are reduced to half, thus improving the performance of D-class audio amplifier, and this is a PAM type improvement.

Figure 7:
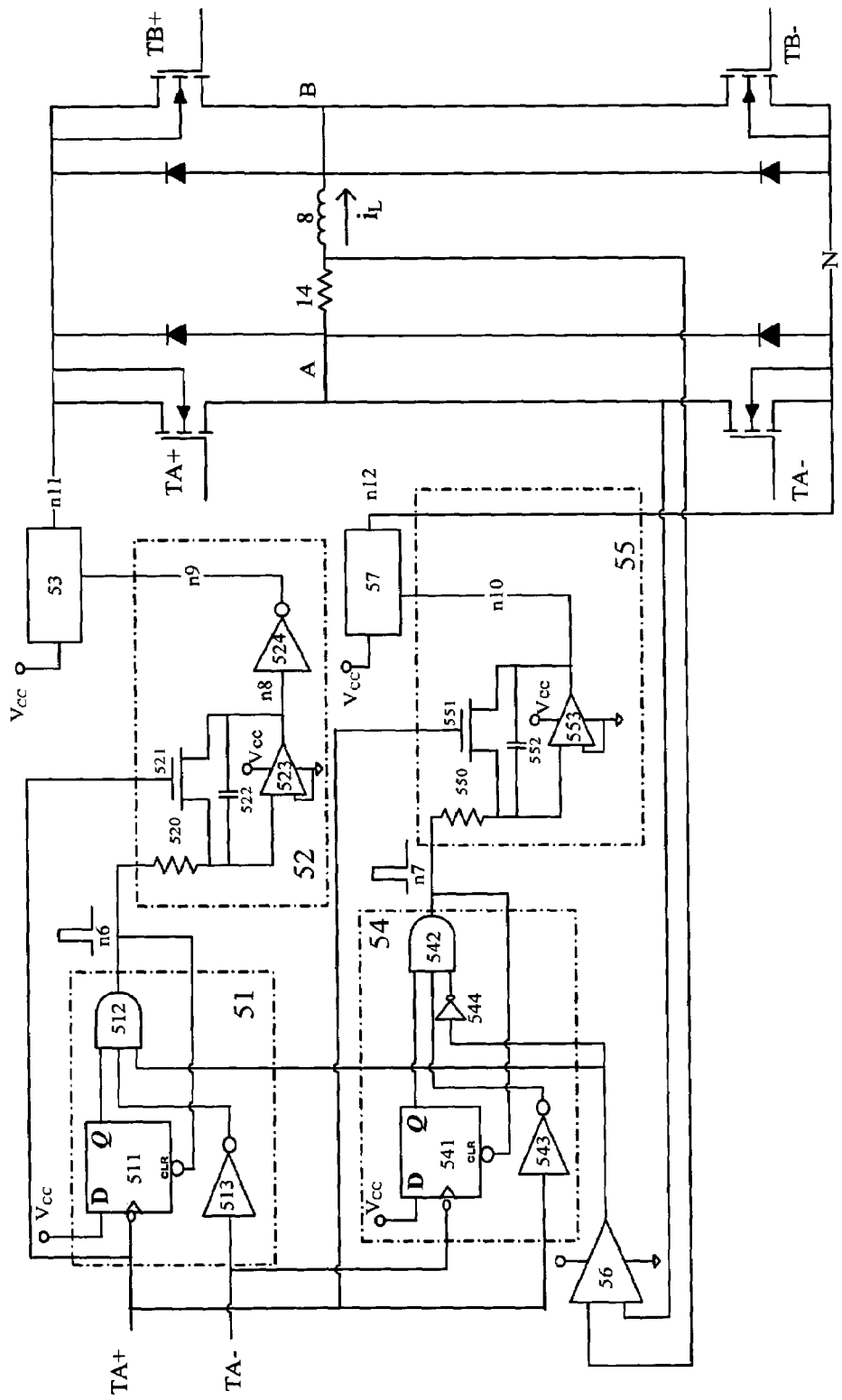
FIG. 7 shows a circuit diagram in accordance with the present invention.

Referring to FIG. 7, which is a circuit diagram in accordance with the present invention. The decision circuit 56 for judging the polarity of the current is substantially a comparator. The "superfluous area" detection pulse generator 51 comprises a D flip-flop 511, an AND gate 512 and an inverter 513. TA+ and TA− are inputted as shown, the output of the decision circuit 56 is inputted to the AND gate 512. When the current of the resistor 14 is negative, the AND gate 512 is able to output signal, as shown in the figure. This circuit is able to produce corresponding pulse n6, as shown in FIG. 8, during the dead time caused between the declination of the TA+ and the rising of the TA−.

The pulse n6 is inputted to the integrator 52 which comprises a resistor 520, a MOS 521 (Metal Oxide Semiconductor), a capacitor 522, an operational amplifier 523 and an inverter 524. And the pulse waveform outputted from the integrator 52 is shown by the waveform n9 in FIG. 8.

Figure 8:
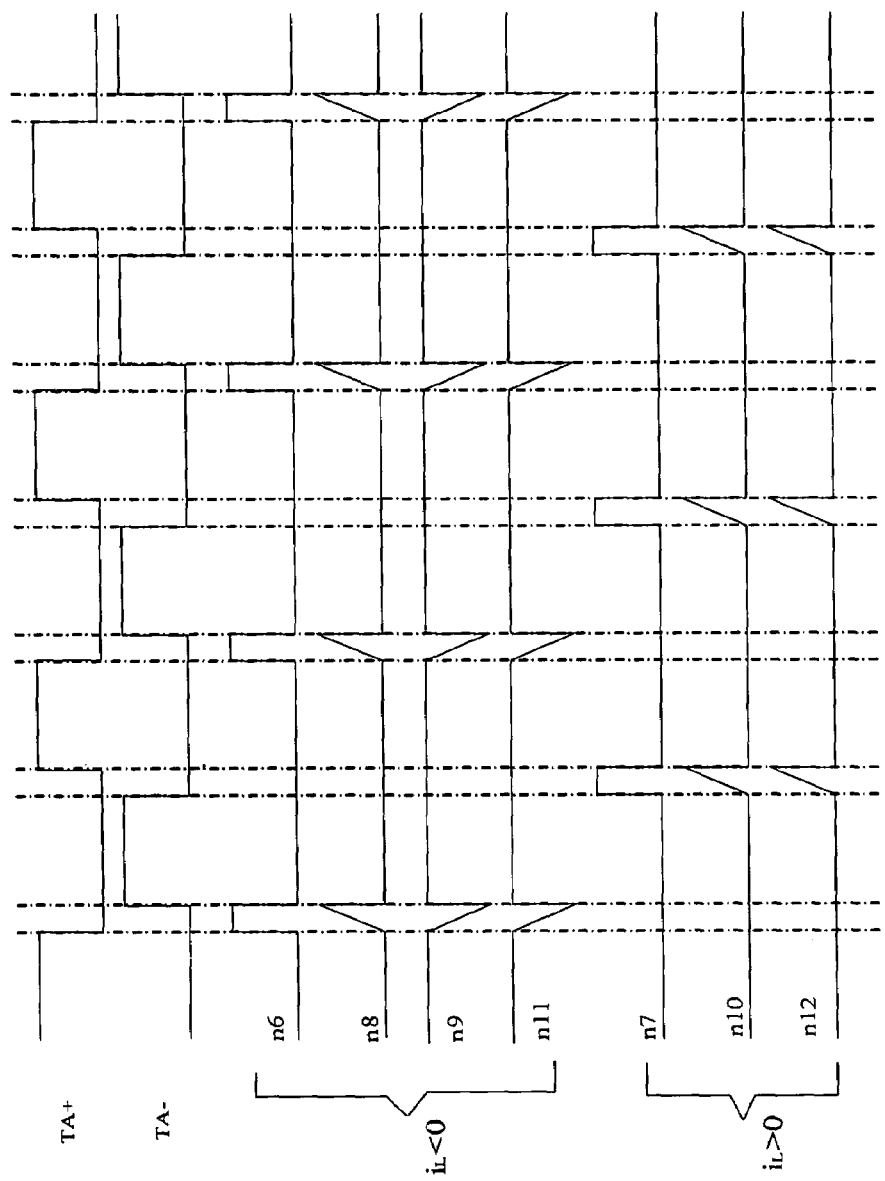
FIG. 8 shows the circuit waveforms in accordance with the present invention.

The pulse n9 is inputted to the voltage regulator 53 to lower the voltage of $V_{cc}$ to zero gradually, as shown by the waveform n11 in FIG. 8. The voltage regulator 53 is designed to drag the voltage of $V_{cc}$ so as to turn the "superfluous area" 31 of FIG. 3 into the "triangular area" 61 at the bottom right of FIG. 6. Thereby, the original "superfluous area" is reduced to half, the performance of D-class audio amplifier is improved, and this is a PAM type improvement.

The "loss area" detection pulse generator 54 comprises a D flip-flop 541, an AND gate 542 and an inverter 543. TA+ and TA− are inputted, the output of the decision circuit 56 is iuputted to the AND GATE 542 via an inverter 544. When the current of the resistor 14 is positive, the AND gate 542 is able to output signal, as shown in the figure. This circuit is able to produce corresponding pulse n7, as shown in FIG. 8, during the dead time caused between the declination of TA− and the rising of TA+.

The pulse n7 is inputted to the integrator 55 which comprises a resist or 550, a MOS 551, a capacitor 552 and an operational amplifier 553. And the pulse outputted from the integrator 55 is designated by n10 in FIG. 8.

The pulse n10 is inputted to the voltage regulator 57 in order to compensate the voltage at point N, as shown by the waveform n12 in FIG. 8, so as to turn the "loss area" 32 of FIG. 3 into the "triangular area" 62 at the bottom left of FIG. 6. Thereby, the original "loss area" is reduced to half, thus improving the performance of D-class audio amplifier, and this is a PAM type improvement.

The voltage regulators 53 and 57 are TEXAS INSTRUMENTS' integrated circuit LM317M.

While we have shown and described various embodiments in accordance with the present invention, it should be clear to those skilled in the art that further embodiments may be made without departing from the scope of the present invention.

What is claimed is:

1. A PAM (Pulse Amplitude Modulation) method for improving the performance of a D-class audio amplifier, the D-class audio amplifier is inputted with a PWM signal and designed to have a dead time design for time-delay function, in order to decrease the distortion of an output signal caused by the dead time design, the method comprising the following steps:

connecting a resistor and a loudspeaker in series to an output terminal of the D-class audio amplifier, and designing a decision circuit to determine the polarity of the current flowing through the resistor;

adding a voltage adjustment circuit to a power source of the D-class audio amplifier to lower the voltage of the power source of the D-class audio amplifier from high voltage to low voltage during dead time when the current of the resistor is negative;

adding a voltage compensation circuit to a low voltage point of the D-class audio amplifier to compensate the voltage of the low voltage point of the D-class audio amplifier for ascending the voltage of the low voltage point from low voltage to high voltage during the dead time when the current of the resistor is positive.

2. The PAM (Pulse Amplitude Modulation) method for improving the performance of a D-class audio amplifier as claimed in claim 1, wherein the voltages at both ends of the resistor are inputted to an input terminal of the decision circuit, an output of the decision circuit is inputted to the voltage adjustment circuit, and the output of the decision circuit is inputted to the voltage compensation circuit via an inverter.

3. The PAM (Pulse Amplitude Modulation) method for improving the performance of a D-class audio amplifier as claimed in claim 1, wherein the voltage adjustment circuit comprises a "superfluous area" detection pulse generator, an integrator and a voltage regulator.

4. The PAM (Pulse Amplitude Modulation) method for improving the performance of a D-class audio amplifier as claimed in claim 1, wherein the voltage compensation circuit comprises a "loss area" detection pulse generator, an integrator, and a voltage regulator.

5. The PAM (Pulse Amplitude Modulation) method for improving the performance of a D-class audio amplifier as claimed in claim 2, wherein the decision circuit is a comparator.

6. The PAM (Pulse Amplitude Modulation) method for improving the performance of a D-class audio amplifier as claimed in claim 3, wherein the "superfluous area" detection pulse generator comprises a D flip-flop, an AND gate and an inverter; the integrator comprises a resistor, a MOS, a capacitor, an operational amplifier and an inverter; the voltage regulator is TEXAS INSTRUMENTS' integrated circuit LM317M or its equivalent.

7. The PAM (Pulse Amplitude Modulation) method for improving the performance of a D-class audio amplifier as claimed in claim 4, wherein the "loss area" detection pulse generator comprises a D flip-flop, an AND gate and an inverter, the integrator comprises a MOS, a resistor, a capacitor and an AND gate, the voltage regulator is TEXAS INSTRUMENTS' integrated circuit LM317M or its equivalent.

* * * * *